United States Patent [19]

Atsumi

[11] Patent Number: 5,001,302
[45] Date of Patent: Mar. 19, 1991

[54] CONNECTING STRUCTURE FOR AN ELECTRONIC PART

[75] Inventor: Yoshinori Atsumi, Oome, Japan

[73] Assignee: Casio Computer Co., Ltd., Tokyo, Japan

[21] Appl. No.: 436,295

[22] Filed: Nov. 13, 1989

[30] Foreign Application Priority Data

Dec. 29, 1988 [JP] Japan .................. 63-170776[U]

[51] Int. Cl.$^5$ .................................................. H01R 4/04
[52] U.S. Cl. ................................. 174/94 R; 29/513; 29/514; 174/84 R; 174/88 R; 439/66; 439/91; 252/503
[58] Field of Search ............. 174/94 R, 84 R, 88 R; 29/868, 872, 873; 252/512, 513, 514, 503; 439/66, 91

[56] References Cited

U.S. PATENT DOCUMENTS

| | | | |
|---|---|---|---|
| 4,113,981 | 9/1978 | Fujita et al. | 174/88 R |
| 4,362,903 | 12/1982 | Eichelberger et al. | 174/94 R |
| 4,496,475 | 1/1985 | Abrams | 252/571 X |
| 4,568,592 | 2/1986 | Kawaguchi et al. | 252/512 X |
| 4,642,421 | 2/1987 | Dery et al. | 174/88 R |
| 4,696,764 | 9/1987 | Yamazaki | 252/513 X |
| 4,701,279 | 10/1987 | Kawaguchi et al. | 252/512 X |
| 4,731,503 | 3/1988 | Kitanishi | 174/88 R |
| 4,740,657 | 4/1988 | Tsukagoshi et al. | 174/94 R X |
| 4,795,895 | 1/1989 | Hara et al. | 283/904 |
| 4,814,040 | 3/1989 | Ozawa | 156/634 |
| 4,868,637 | 9/1989 | Clements et al. | 174/88 R X |

FOREIGN PATENT DOCUMENTS

2068645 A 8/1981 United Kingdom .

Primary Examiner—Morris H. Nimmo
Attorney, Agent, or Firm—Frishauf, Holtz, Goodman & Woodward

[57] ABSTRACT

A connecting structure for an electronic part employs an improved anisotropic electrically conductive layer. The layer includes a hot melt type insulative adhesive, heat resilient particles and carbon particles. Each of the heat resilient particles is made of thermoplastic resin and is plated with metal such as gold, nickel or the like. Each of the carbon particles is melted by a heat pressure and brings about an electric conductivity when it is dried and hardened. Thus, the anisotropically conductive layer disclosed in this invention does not include hard particles at all. Namely, an electronic part such as a solar battery cell or a semiconductor device is not damaged by particles of the conductive layer. In addition, the connecting structure employing the aforementioned layer improves the security of adherence and the reliability of the electric conductivity.

8 Claims, 2 Drawing Sheets

CONNECTING STRUCTURE FOR AN ELECTRONIC PART

BACKGROUND OF THE INVENTION

1. Field of the Invention

This invention relates to a connecting structure for an electronic part, for example, for connection of a solar cell to a printed wiring board.

2. Description of the Related Art

In an electronic device such as a portable calculator, such electronic parts as a solar cell, an IC chip and a liquid crystal display panel are mounted on a printed wiring board. In this case, it is known that the electronic parts (e.g., solar cell) are attached to terminals of the wiring board by means of an anisotropic conductive adhesive. In general, such an anisotropic conductive adhesive is formed by mixing metallic particles in a hot-melt type insulative adhesive, or mixing thermoplastic resin particles, having their outer peripheral surfaces plated with metal substance, in a hot-melt type insulative adhesive. In either anisotropic conductive adhesive, the hot-melt insulative adhesive is mixed with such an amount of conductive particles that, at the time of thermal compression, the adhesive has electrical conductivity in the direction of thickness and has an insulating property in the direction of the surface (i.e., a direction perpendicular to the direction of thickness). When external terminals of the electronic parts are connected to connection terminals of the wiring board by this anisotropic conductive adhesive, the connection therebetween is ensured by the hot-melt type insulative adhesive contained in the anisotropic conductive adhesive and the electrical conductivity therebetween is provided by the conductive particles mixed in the hot-melt type insulative adhesive.

However, when the electronic part includes a semiconductor element such as a solar cell, if the anisotropic conductive adhesive mixed with metallic particles is used, the metallic particles directly come into contact with the solar cell. In this case, there is a concern that the solar cell formed of a semiconductor such as amorphous silicon may be destroyed. Also, where the anisotropic conductive adhesive mixed with plate resin particles is used, the resin particles, which are soft, may be deformed at the time of the thermal compression. In this case, the particles are flattened and the amount of the hot-melt type insulative adhesive is reduced between the resin particles and the strength of adherence is decreased. Also, the deformed resin particles have a spring-back force, and there is a high possibility that the deformed resin particles are returned to the original shape, while the adhesive is completely hardened. Thus, reliable electrical conductivity is not attained.

SUMMARY OF THE INVENTION

The object of the present invention is to provide an electric connecting structure including a conductive adhesive and an electronic part such as a solar cell, wherein the electronic part is prevented from destruction, and stable electrical conductivity is attained after the electronic part is connected to another body.

The electric connecting structure according to the present invention, comprises:

a substrate having connecting pads;
an electronic part having terminals;
an electrically conductive adhesive disposed between said connecting pads of said substrate and said terminals of said electronic part, and including:

a hot melt-melt type insulative adhesive, heat resilient particles each of which has a thermosoftening property and electrical conductivity, and carbon particles, said heat resilient particles and said carbon particles being dispersed in said insulative adhesive so as to form substantially a single plane.

DETAILED DESCRIPTION OF THE PREFERRED EMBODIMENTS

An embodiment of the present invention will now be described with reference to the accompanying drawings.

Figure 2:
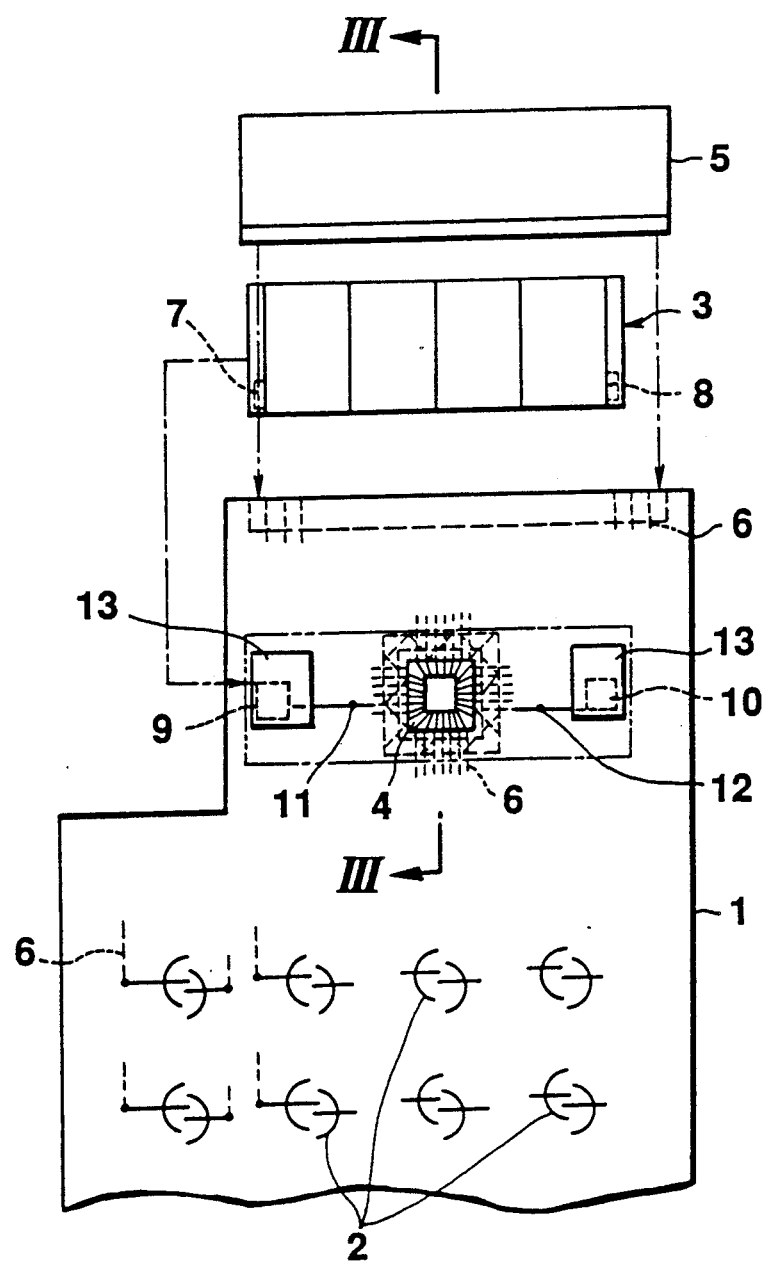
FIG. 2 is a plan view showing the wiring board and various electronic parts including the solar cell, in the state wherein they have not yet been connected.

FIG. 2 is a plan view of an electronic part assembly used in portable calculator. A plurality of stationary contacts 2, each comprising a pair of electrodes and constituting a key switch on a keyboard, are formed at predetermined intervals, by a printing process, on a lower area of the upper surface of a wiring board 1. A solar cell 3 is arranged on an upper area of the upper surface of the wiring board 1. An IC unit 4 formed by a TAB (Tape Automated Bonding) process is attached on an upper area of the lower surface of the wiring board 1. A liquid crystal panel 5 is attached on an upper edge portion of the lower surface of the wiring board 1. Each of stationary contacts 2, solar cell 3, and liquid crystal panel 5 are electrically connected to the IC unit 4 by a wiring pattern formed on the lower surface of the wiring board 1. Thus, when electric power is supplied from the solar cell 3 to the IC unit 4 and the keyboard is operated to close the stationary contacts 2 thereby to input information, the result of arithmetic operations performed in the IC unit 4 is displayed.

Connection terminals 9 and 10, which are electrically connected to external terminals 7 and 8 of the solar cell 3, are formed on the upper surface of the wiring board 1. Each of connection terminals 9 and 10 has a greater area than each of external terminals 7 and 8 of the solar cell 3. The connection terminals 9 and 10 are connected, via through-holes 11 and 12, to the wiring pattern 6 on the lower surface of the wiring board 1.

The external terminals 7 and 8 of solar cell 3 are attached to the connection terminals 9 and 10 by means of an anisotropic conductive adhesive 13. The anisotropic conductive adhesive 13 is formed, by a printing process, on the connection terminals 9 and 10 such that the adhesive 13 covers the terminals 9 and 10. The solar cell 3 is temporarily mounted on the wiring board 1 such that the external terminals 7 and 8 of solar cell 3 are overlapped with those portion of the anisotropic conductive adhesive 13 which correspond to the connection terminals 9 and 10. Then, the terminals 7, 8, 9 and 10 are subjected to terminal compression, so that the external terminals 7 and 10 are completely attached to the connection terminals 9 and 10.

Figure 1:
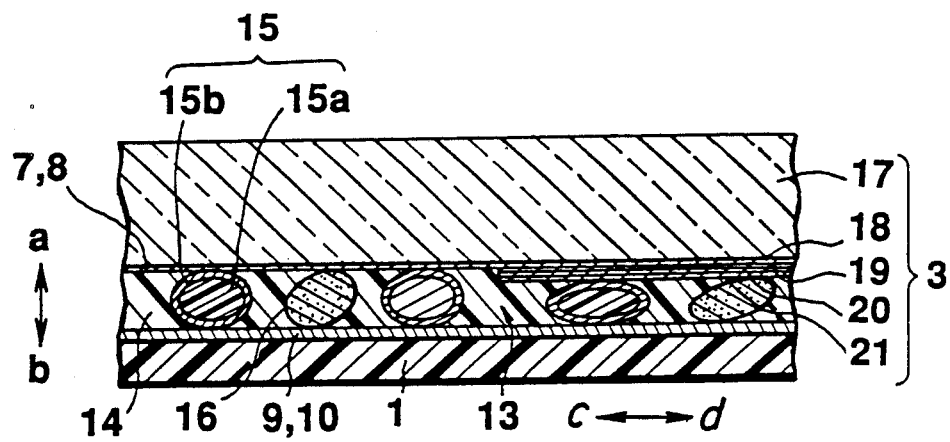
FIG. 1 is an enlarged cross section illustrating the state of connection between a solar cell and a wiring board.

FIG. 1 is an enlarged cross section illustrating the state of connection between the solar cell 3 and the wiring board 1.

The connection terminals 9 and 10 formed on the upper surface of wiring board 1 are formed of a metal foil or electrically conductive ink such as carbon ink. The solar cell 3 has a structure wherein one electrode 18, a solar cell element 19 formed of amorphous silicon, another electrode 20, and a protection layer 21 are sequentially laminated on one surface of a cell body 17 formed of transparent glass. The electrode 18 extends towards an end portion of the cell body 17. The extending portion of the electrode 18 corresponds to the external terminal 7 or 8. The extending portion of the electrode 18 is marked as the external terminal 7, while an extending portion (not shown) of the other electrode 20 is marked as the external terminal 8.

An anisotropic conductive adhesive 13 is formed by mixing a hot-melt type insulative adhesive 14 with heat resilient particles 15 and carbon particles 16. The heat resilient particles 15 include thermoplastic resin particles 15a such as acryl and metal 15b, such as gold or nickel, with which the particles 15a are plated. The ratio of mixture of particles 15 to 16 is determined such that the anisotropic conductive adhesive 13, when subjected to thermal compression, has conductivity in the direction of thickness (arrows a and b) and an insulating property in the direction of the surface (arrows c and d). When the external terminals 7 and 8 of solar cell 3 are connected to the connection terminals 9 and 10 of wiring board 1 by means of the anisotropic conductive adhesive, the carbon particles 16 are present between the heat resilient particles 15 mixed in the hot-melt type insulative adhesive 14. The carbon particles 16 mixed carbon with coherent soluble are electrically conductive, and are melted by thermal compression to exhibit an adhesive property. Thus, even if the heat resilient particles 15 are deformed and flattened by the thermal compression, so that the amount of the hot-melt type insulative adhesive 14 existing between the heat resilient particles 15 is reduced, the adhesion force of the anisotropic conductive adhesive is reinforced by the carbon particles 16. (In prior art, non-adhesive conductive particles occupy the positions of the carbon particles 16.) The external terminals of solar cell 3 can therefore be connected to the connection terminals 9 and 10 of wiring board 1, with a predetermined adhesive strength. Even if the heat resilient particles 15 are made non-conductive due to a spring-back subsequent to the thermal compression, the carbon particles 16, which are electrically conductive, maintain the electrical connection between the external terminal 7 (8) and the connection terminal 9 (10). Further, since the heat resilient particles have thermosoftening properties and the carbon particles 16 are melted by the thermal compression, the solar cell element 19 is never destroyed. In other words, if the conductive particles were hard, they would break the protection layer 21, electrode 20 and solar cell element 19, and enter the p-, i-, and n-type layers (not shown) in the solar cell element and destroy the junction thereof. In the present invention, however, neither heat resilient particles 15 nor carbon particles 16 cause damage to the protection layer 21, as shown in FIG. 1.

Figure 3:
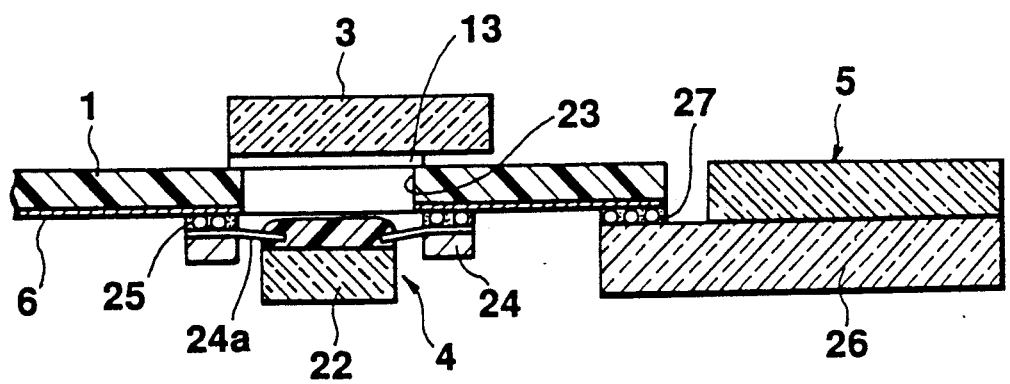
FIG. 3 is a cross section taken along line III—III in FIG. 2, wherein the wiring board and the electronic parts have been connected.

FIG. 3 shows the state wherein an IC unit 4 and a liquid crystal panel 5 are integrally attached to the wiring board 1 on which the solar cell 3 is mounted.

An opening 23, which is slightly larger than the size of the IC unit 4, is formed in the wiring board 1. The solar cell 3 is mounted on one surface of the wiring board 1 such that it covers the opening 23. The IC unit 4 is mounted on the other surface of the wiring board 1 in a position corresponding to the opening 23 of the wiring board 1. In other words, the IC unit 4 and the solar cell 3 are laminated with the wiring board 1 interposed. Compared to an arrangement wherein the IC unit 4 and the solar cell 3 are juxtaposed, the area of the wiring board 1 can be reduced.

The IC unit 4 is formed by bonding an IC chip 22 to finger leads 24a provided on a carrier tape 24, that is, by a so-called TAB (Tape Automated Bonding) process.

The IC unit 4 is connected to the wiring pattern 6 by means of an anisotropic conductive adhesive 25. The anisotropic conductive adhesive 25 may be made of the same material as the anisotropic conductive adhesive 13. Where the IC unit 4 formed by the TAB process is connected to the wiring pattern 6, a semiconductor element in the IC chip 22 neither contacts nor destroys the conductive particles in the adhesive. Thus, the anisotropic conductive adhesive 25 may be formed by mixing metallic particles in a hot-melt type insulative adhesive.

The liquid crystal display panel 5 is attached to an upper edge portion of the wiring board 1 by means of an anisotropic adhesive 27, such that the electrode surface (not shown) of the liquid crystal display panel 5 faces the wiring board 1.

The above-described connecting structure, wherein the solar cell 3, IC unit 4 and liquid crystal display panel 5 are connected to the wiring board 1 by means of the anisotropic conductive adhesives 13, 25 and 27, has a small size and can be manufactured efficiently at low cost.

The anisotropic conductive adhesive containing heat resilient particles 15 and carbon particles 1 is applicable to a connecting structure for various parts. In particular, the anisotropic conductive adhesive brings about salient effects when it is applied to an electronic part having a semiconductor element, such as a solar cell. In another example, where an IC circuit chip is mounted on a wiring board by a direct face-down bonding, a thermal head and an image read device can be advantageously connected to the wiring board or a connector.

What is claimed is:

1. An electric connecting structure including a conductive adhesive and an electronic part, comprising:
    a substrate having connecting pads;
    an electronic part having terminals;
    an electrically conductive adhesive disposed between said connecting pads of said substrate and said terminals of said electronic part, and including:
    a hot-melt type insulative adhesive, heat resilient particles each of which is thermosoftening and electrically conductive, and carbon particles, said heat resilient particles and said carbon particles being dispersed in said insulative adhesive so as to form substantially a single plane.

2. The electric connecting structure according to claim 1, wherein said electrically conductive adhesive has an anisotropic conductivity which shows a conductive property in a direction of thickness of said conductive adhesive and an insulative property in a direction of a plane of said conductive adhesive.

3. The electric connecting structure according to claim 2, wherein said electronic part includes a semiconductor layer.

4. The electric connecting structure according to claim 3, wherein said electronic part is a solar battery cell.

5. The electric connecting structure according to claim 1, wherein said heat resilient particles are substantially alternated with said carbon particles.

6. The electric connecting structure according to claim 5, wherein said electronic part is a solar battery cell.

7. The electric connecting structure according to claim 6, wherein said substrate further includes other connecting pads formed on an opposite side to said solar battery cell within an area corresponding to said solar battery cell.

8. The electric connecting structure according to claim 7, wherein electrodes of a semiconductor device are connected to said other connecting pads of said substrate.

* * * * *